United States Patent [19]

Caprari

[11] Patent Number: 4,625,120
[45] Date of Patent: Nov. 25, 1986

[54] DEEP ULTRAVIOLET (DUV) FLOOD EXPOSURE SYSTEM

[75] Inventor: Fausto Caprari, East Brunswick, N.J.

[73] Assignee: RCA Corporation, Princeton, N.J.

[21] Appl. No.: 605,245

[22] Filed: Apr. 30, 1984

[51] Int. Cl.[4] .............................................. H01L 21/26
[52] U.S. Cl. .............................. 250/492.1; 250/504 R
[58] Field of Search ............. 250/493.1, 492.1, 504 R, 250/503.1, 454.1, 455.1; 350/276 R, 276 SL; 362/310, 339, 337, 329

[56] References Cited

U.S. PATENT DOCUMENTS

| | | | |
|---|---|---|---|
| 675,693 | 11/1900 | Egnell | 362/302 |
| 1,200,587 | 10/1916 | Cloninger | 362/304 |
| 2,179,161 | 11/1939 | Rambush et al. | 362/302 |
| 2,640,148 | 5/1953 | McCandless | 362/349 |
| 2,670,656 | 3/1954 | Braymer | 350/276 SL |
| 3,354,304 | 11/1967 | Freeman | 362/310 |
| 3,911,318 | 10/1975 | Spero et al. | 315/39 |
| 3,922,084 | 11/1975 | Sheets | 362/309 |
| 3,983,039 | 9/1976 | Eastland | 250/492 R |
| 4,243,917 | 1/1981 | Caprari | 315/241 R |
| 4,378,583 | 3/1983 | Caprari | 362/263 |
| 4,421,987 | 12/1983 | Herold | 250/492.1 |
| 4,489,366 | 12/1984 | Rozniecki | 362/310 |

FOREIGN PATENT DOCUMENTS 1380020  1/1975  United Kingdom ................ 303/373

OTHER PUBLICATIONS

Lin, "Multi-Layer Resist Systems as a Means to Submicron Optical Lithography," IEDM 1982, pp. 391-393.

Griffing, "An Operational Two Level Photoresist Technology," IEDM 1981, pp. 562-565.

Ma, "Plasma Resist Image Stabilization Technique (PRIST) Update," SPIE vol. 333 Submicron Lithography (1982), pp. 19-23.

Allen, Foster, Yen, "Deep U.V. Hardening of Positive Photoresist Patterns," J. Electrochemical Soc., Jun. 1982, vol. 129, pp. 1379-1381.

Fusion Systems Corp., Fusion UV Curing Systems, 1982, SB 536 8-82-5M.

Ruggerio, "Positive Photoresist Polymerization Through Pulsed Photomagnetic Curing," Solid State Technology/Mar. 1984, pp. 165-169.

Primary Examiner—Bruce C. Anderson
Assistant Examiner—Paul A. Guss
Attorney, Agent, or Firm—Birgit E. Morris; Donald S. Cohen

[57] ABSTRACT

Apparatus for irradiating deep ultraviolet (DUV) photoresist-sensitive material on a single substrate, such as a wafer, from a xenon lamp source providing pulsed radiation in the DUV range. A spherical reflector reinforces direct radiation to provide a radiation beam with predetermined divergence confined by a cylindrical baffle. The walls of the baffle are either reflective or absorptive to provide either a curing function or mask exposure imaging function as desired.

A wafer having single layer or multi-layer photoresist material sensitive to DUV is either exposed for imaging for pattern development with high resolution and uniformity even with thin photoresist layers or for curing the patterned layers.

10 Claims, 3 Drawing Figures

DEEP ULTRAVIOLET (DUV) FLOOD EXPOSURE SYSTEM

This invention relates to an apparatus for flood exposing with direct DUV radiation a substrate, such as a wafer, having a coating of photosensitive resist material.

BACKGROUND OF THE INVENTION

In the processing of semiconductor products of the type used for very large scale integrated (VLSI) circuit devices, to either image or cure the photoresist material for the very small geometries is difficult for several reasons. One of the essential requirements of a photoresist is its ability to withstand high temperatures while retaining control of both edge profile and line dimensions. It is known that, in order to fabricate VLSI devices, reactive ion etching (RIE) in a plasma chamber is essential to reproduce the photoresist geometry required. Sometimes the temperature in the plasma chamber can be so high that it causes the photoresist material to flow, if not to burn. Moreover, the choices of photoresist materials and the materials to be etched are very limited when RIE is to be performed. Accordingly, high temperatures and tougher resist materials are required for RIE for curing and stabilization procedures.

Photoresist material sensitive to deep ultraviolet (DUV) exposure is being used more widely in this art to overcome the problems of RIE outlined above. For example, poly(methylmethacrylate) (PMMA) is being widely used in conjunction with diazo-type photoresists, such as Kodak 809 or Shipley AZ 1350J positive photoresist material. They are used to provide so-called double-layer or multi-layer photoresists for certain advantages in the curing and imaging steps. See the article by B. J. Lin entitled, "Multi-Layer Resist Systems as a Means to Submicron Optical Lithography," IDEM 1982, pages 391-394, and the article by B. F. Griffing entitled, "An Operational Two Level Photoresist Technology," IDEM 1981, pages 562-565, for detailed descriptions of such multi-layer resist systems.

There are known apparatus for improving the thermal properties of photoresists, such as PRIST (Photo Resist Image Stability Technique), described by W. H. L. Ma, "Plasma Resist Image Stabilization Technique (PRIST) Update," *Proc. Submicron Lithography*, vol. 333, pp. 19-23, SPIE, Bellingham, Wash., 1982, or DUV treatment of photoresists followed by a high temperature bake as described by R. Allen, M. Foster, Y. T. Yen, "Deep U.V. Hardening of Positive Photoresist Patterns," *J. Electrochemical Soc.*, vol. 129, pp. 1379-1381, 1982. However, the disadvantage of the PRIST system is that the process needs a plasma etcher which is very complex and costly. Moreover, it is very difficult to install production photoresist stablization equipment for such processes. The Fusion Corporation of Rockville, Md. provides a DUV apparatus that utilizes microwave energy to excite a mercury vapor lamp. However, the disadvantage of this DUV approach is that the apparatus is bulky and generates a lot of heat.

In the art of flood exposure, for either curing a photoresist material or exposing the photoresist material, as for multi-level pattern image processing, the illumination apparatus must not overheat the resist material. In spite of the efforts, for example, as outlined above, there is a need in the art for apparatus for flood exposing photoresist material rapidly and with good resolution either for imaging purposes or for curing the material without damaging it.

Griffing, cited above, for example, describes a DUV blanket exposure equipment using a cadmium (Cd) arc lamp. Since the radiation from a Cd arc lamp is not collimated, Griffing describes the use of a baffle structure to provide some collimation of the beam by absorbing the stray radiation that is not substantially collimated. A cylindrical reflector is used to guide the radiation from the source to the wafers. Griffing describes that the critical limitation of the cut-off angle of approximately 20° was required, however, to effect imaging 1.5 micrometers thick PMMA photoresist for developing 0.5 micrometer lines.

SUMMARY OF THE INVENTION

According to the present invention, a direct beam of DUV radiation from a pulsed xenon lamp and a beam from the lamp reflected from a spherical mirror, are combined to provide a pulsed radiation beam used either for imaging a substrate, such as a wafer, having a surface layer of UV sensitive material. A cylindrical baffle having a diameter larger than the wafer confines the beam to a cylindrical pattern directed to the wafer surface. The inner wall of the cylinder is absorptive to provide a radiant beam for imaging of the photoresist material for patterning.

DETAILED DESCRIPTION OF THE PREFERRED EMBODIMENT

Figure 1:
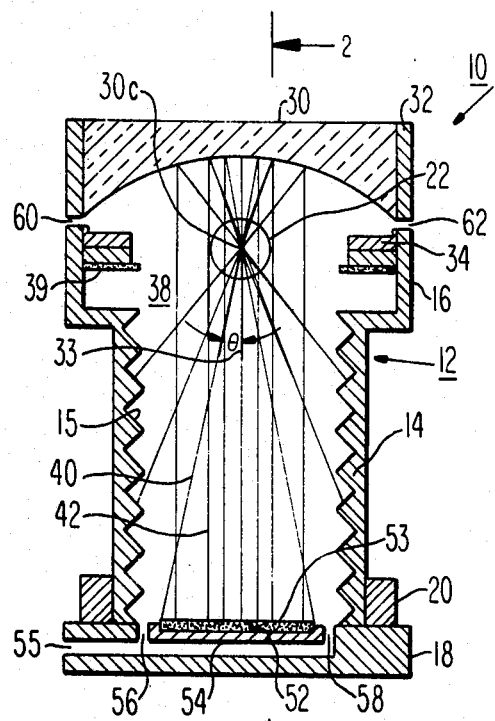
FIG. 1 is a schematic, partly in section, of one embodiment of the apparatus of the invention.

The apparatus 10, according to one embodiment of the invention, is formed of a cylindrical baffle assembly 12 having a wall 14 and an enlarged portion 32 with a surface 16 defining a chamber 38. The assembly 12 is removably supported on a base 18 and fixed in position by a ring 20.

A wafer 52 is supported by a support 54. The assembly 12 can be lifted from the support 54 to allow for loading or unloading a wafer 52. Coolant gas, such as nitrogen, is passed into the assembly via apertures 55, 56, and 58 and is exited via apertures 60 and 62. Nitrogen serves to purge the chamber of the undesireable ozone gas. The wafer 52 is provided with one or more layers of photoresist material on the wafer surface 53.

Figure 2:
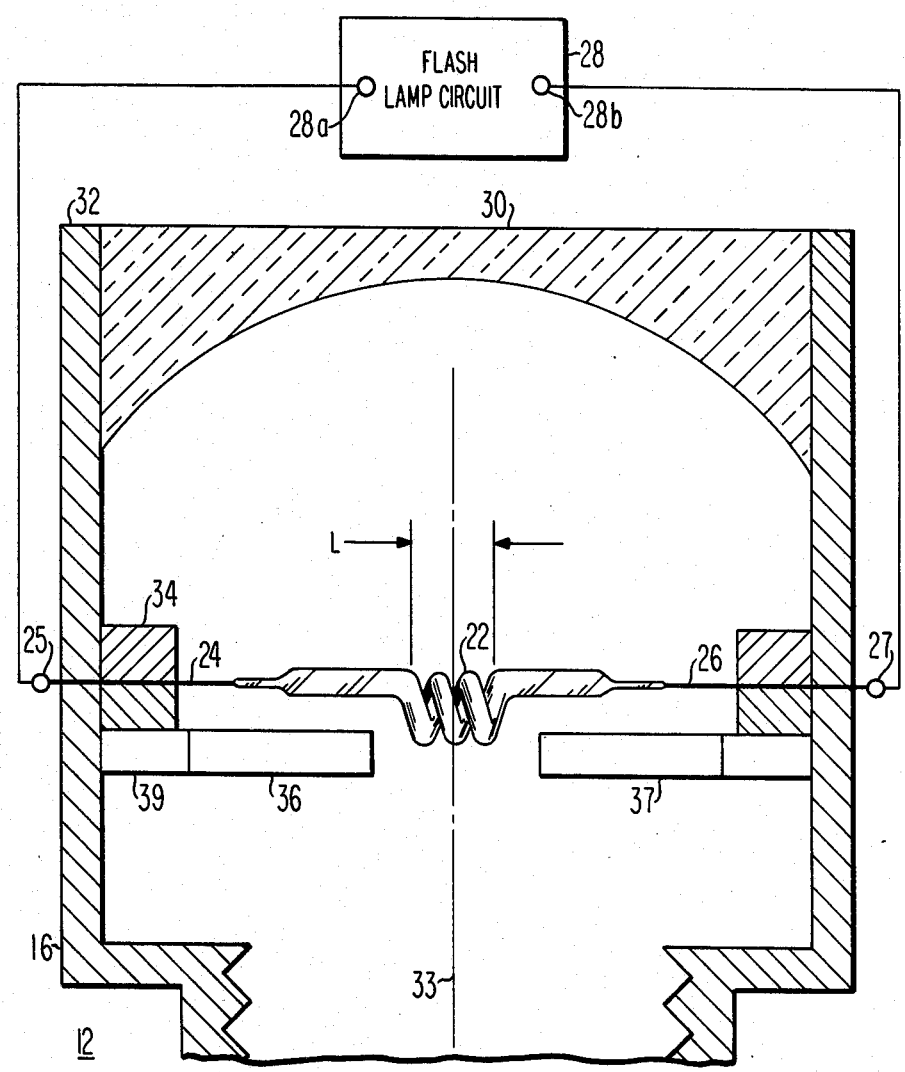
FIG. 2 is a fragmentary view of FIG. 1 in section as seen along viewing line 2—2 showing the helical lamp and connection to a flash lamp circuit.

A tubular lamp 22 is formed preferably in a helical arrangement of several turns as shown in FIG. 2. The tube of the lamp 22 contains xenon gas and is the type which is available from a vendor, such as ILC Technology of Sunnyvale, Calif., Model L-4875. The geometric center of the lamp 22 is the effective center of the source of radiation generated by the lamp. The lamp 22 is preferably one inch (2.54 cm.) long over the several turns (dimension L in FIG. 2) and, as such, appears as a spherical source of radiation from a sphere of one-inch diameter. The lamp 22 has a pair of electrodes 24 and 26 extending longitudinally along the axis of the helical turns. The lamp electrodes 24 and 26 are clamped in position by a clamping ring 34 and are extended externally of the assembly 12 to connect at terminals 25 and 27. The terminals 25 and 27 are, in turn, connected by conductors to the respective terminals 28a and 28b of a flash lamp circuit 28. The lamp circuit 28 is suitably the type circuit described in my U.S. Pat. No. 4,243,916, issued Jan. 6, 1981. A straight tubular lamp is useful but not as effective as the helical form.

A reflector or mirror 30 has a spherical surface with a focus 30c (FIG. 1). The mirror 30 is supported by the cylindrical member 32. The lamp 22 is positioned within the housing of the apparatus 10 such that its geometric center is coincident with the mirror focus 30c on the optical axis 33 of the apparatus. The lamp electrode portions 24 and 26 typically provide a hot spot of high intensity radiation which is undesirable when the apparatus is used to expose a mask on the photoresist surface. Accordingly, for such use it is preferred that a pair of opaque shields 36 and 37 attached to a ring 39 (FIG. 2) be provided to shield those hot spots and prevent radiation therefrom being passed downwardly into the chamber 38 directly or by reflection from the mirror 30. A suitable shield is described in my U.S. Pat. No. 4,378,583, issued Mar. 21, 1983.

Radiation from the lamp 22 will be generally in a spherical pattern. However, the apparatus 10 provides for radiation that is essentially collimated for imaging on the photoresist, or in the alternative, highly reflective for curing the patterned photoresist. The principal beam of radiation from the center of the lamp 22 is defined by conical rays 40 and cylindrical rays 42. In addition, many other rays are eminating from the lamp 22 from different portions of the helix. The rays of radiation passing upwardly to the spherical reflector 30 are reflected therefrom at an angle depending upon the angle of incidence to the reflector surface. These reflected rays either pass directly down the generally cylindrical path defined by the assembly 12 or are incident to the inner surface of the wall 14 of the assembly 12.

In order to prevent unwanted reflections from passing to the wafer to provide thereby a substantially collimated beam of radiation, the inner surface of the wall 14 of the cylindrical baffle 12 is provided with grooves 15 to reflect the incident radiation away from the wafer 52. The grooves 15 are circular or preferably formed as a continuous helix with triangular or slanted walls that are about 1/16 inch deep. The pitch of the helix is about 20 per inch. With such an arrangement, the radiation striking the wall 14 will be reflected along a path that does not strike the surface 53 of the wafer 52. Accordingly, most of the radiation received from the lamp 20, whether directly downwardly toward the wafer, or reflected from the spherical reflector 30, is approximately collimated.

There is, however, a certain divergence of the beam since the source 22 is not a point source. The divergence angle θ is about 12° for the source 22 of one inch in length and a distance between the source 22 and the four-inch wafer surface 53 of 9.5 inches. The divergence angle θ can be modified by changing the distance to the wafer surface 53.

For patterning purposes, the divergence angle is desirably small in order to achieve images with high resolution. For curing purposes, the divergence angle θ is desirably large in order to irradiate near-vertical side walls of the patterned image. However, in practice, the side walls of the patterns will be adequately irradiated by beams with 12° divergence for curing purposes. Moreover, a beam of 12° divergence is adequate for many imaging purposes.

Figure 3:
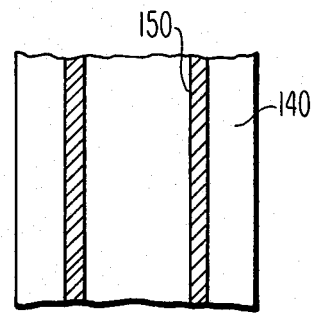
FIG. 3 is a fragmentary view of FIG. 1 showing a modification of FIG. 1.

The cylindrical assembly 12 is suitably made of aluminum and the surface of the wall 14 is preferably coated with a black material to function as an absorber of the radiation for use in the imaging mode. Such a black surface may be a black polytetrafluoroethylene (Teflon) coating. FIG. 3 illustrates this form of the assembly 12 wherein a cylindrical wall 140 replaces the wall 14 shown in FIG. 2. Wall 140 is formed of aluminum and is provided with a black surface 150 to absorb incident uncollimated radiation from the lamp 30.

To use the apparatus for the function of curing a patterned photoresist, the inner surface of the wall 14 of the assembly 12 is arranged as a smooth, full mirror by which the non-collimated radiation will be reflected directly on the surface of the wafer 52 to enhance the radiation collection efficiency of the wafer surface 53.

As mentioned above, the lamp 22 may be cooled by means of a coolant, such as nitrogen gas, passed through an intake opening 54 in the base 18 and several openings 56 and 58 in the upper surface of the base 18. Moreover, inlets 60 and 62 in the upper portion of the apparatus 10, adjacent the spherical mirror 30, provide passageways for the coolant nitrogen gas. In addition, advantageously the nitrogen forms a curtain over the wafer surface during the exposure cycle and thereby inhibits the presence of oxygen in the environ of the chamber 38. Thus, the absence of oxygen inhibited by the curtain of nitrogen will make a more efficient resist exposure, in the spectral region around 200 nanometers, and will thus avoid the formation of ozone gas which is caused by radiation in the range below 200 nanometers radiation.

The xenon lamp 22 is operated at a current density above 3,000 amperes per square centimeter in order to enhance DUV radiation. This lamp, at such current density, is 6% efficient in the DUV spectral region between 200–320 nanometers. Comparably, lamps using xenon-mercury are only about 2% efficient.

The invention is useful in the processing of two-level or multi-level positive photoresist materials that are now being used in the semiconductor art, as described in the above-identified Lin and Griffing articles. The lamp can provide a flash of about 20 millijoules per square centimeter. If a dose requires about 2.5 joules per square centimeter, about 125 flashes, each flash spaced at two to three second intervals, provides the required dosage to either expose for imaging the surface of a wafer provided with photoresist material sensitive or responsive to the radiation in the DUV range or, in the alternative, to cure a patterned surface.

In practice, the invention is also used to expose wafer 52 to radiation for either curing the polymers contained in the patterned photoresist material or for pretreatment of multi-layer photoresist procedures, as explained by the Lin article cited hereinabove. Many experiments have been performed that show the advantages of the apparatus described hereinabove for curing photoresists. For example, in one experiment, six four-inch wafers were coated with various positive and negative resists as follows: four wafers were coated with a Hunt positive resist (HPR204), and Dynachem OFPR 800, and two wafers were coated with a KTI (732) negative resist. The wafers were masked for imaging exposure for patterning the wafers. The six wafers were then exposed in sequence to radiation generated by the apparatus 10 described hereinabove. Using a total exposure dose for each wafer of 125 flashes with three second intervals, the so-treated wafers were then baked at 200° C. The wafers were then processed by RIE or ion implantation.

The experiment showed that a very tough surface layer of photoresist material was developed by the DUV exposure for curing from the apparatus 10. It showed that very small geometry was able to be developed. For example, VLSI device gates of 1.25 micrometers were accurately developed. Moreover, the plasma etch using the RIE technique was achievable on metal layers. After the treatment by the DUV radiation, the adhesion of the various layers was improved, particularly for a thick oxide wet etch whereby no undercutting was manifested because the wafers could be baked at higher temperatures, for example, in the range of 125° to 200° C.

The invention is also useful as stated above in preparing the multi-layer photoresist wafers for subsequent processing steps. For an example, a wafer is provided first with a relatively thick layer of PMMA photoresist covered by a relatively thin layer of diazo-type photoresist made by Shipley type AZ 1350. The wafer is then imaged to activate only the thin layer of the diazo-type photoresist without optically affecting the PMMA layer. Following the imaging of the thin layer, the wafer is exposed to the DUV beam, using the apparatus 10 described hereinabove, wherein the thin layer of the diazo-type photoresist acts as a mask for the PMMA layer. Accordingly, by this procedure of using the DUV radiation, one can develop a multi-layer photoresist pattern without the problems of the prior art. For example, in the prior art with such multi-layer photoresists, high temperature treatments either melt or chars the photoresist material. By first curing the surface layer with the DUV light beam, the surface is stablized and thereby hardened for subsequent ion plasma etching or ion implantation.

What is claimed is:

1. Apparatus for flood exposing a substrate with deep ultraviolet (DUV) radiation, said apparatus having means for positioning a mask to provide an image on the surface of the substrate, and further comprising:
   (a) a reflector comprising a portion of a spherical surface and having an optical axis and a focal point;
   (b) means for providing a pulse of radiation including a tubular xenon lamp;
   (c) said lamp being positioned at the focal point of said reflector to provide a composite beam of radiation comprising a direct beam and a beam reflected from said spherical surface;
   (d) means including a cylindrical baffle positioned with the longitudinal axis of said baffle coincident with the optical axis of said reflector and having a diameter larger than the substrate diameter and having a length extending substantially between said lamp and said substrate for preventing uncollimated radiation directly from said lamp mixing with said collimated beam, to thereby prevent uncollimated light from striking said substrate; and
   (e) means for positioning said substrate in the path of said radiation beam for receiving an image from said mask on the surface of said substrate;
whereby a substantially collimated beam of pulsed deep ultraviolet radiation formed of a direct beam from said lamp and a reflected beam from said spherical surface is passed through said mask and is directed through and parallel to the axis of said baffle to image said substrate.

2. The apparatus of claim 1 wherein said lamp is formed into a plurality of turns to form a helical lamp.

3. The apparatus of claim 2 wherein said helical lamp has electrodes extending longitudinally outward.

4. The apparatus of claim 1 wherein said cylindrical baffle is formed of aluminum having an inner surface of black material to absorb incident uncollimated radiation directly from said lamp.

5. The apparatus of claim 1 wherein said cylindrical baffle has an inner surface that has grooves to reflect incident uncollimated radiation from said lamp away from said composite beam in a path that does not strike the said substrate.

6. The apparatus of claim 5 wherein said grooves are in the form of a helix.

7. The apparatus of claim 3 further comprising an opaque shield to block radiation adjacent to said electrodes from passing into said beam and to allow radiation from said helical lamp comprising said turns to be transmitted to said wafer and to allow reflected radiation from said spherical surface to be transmitted to said substrate.

8. The apparatus of claim 1 further comprising means to provide a coolant gas over said substrate to prevent the formation of ozone gas.

9. The apparatus of claim 1 wherein said xenon lamp has a high radiance spectrum in the range of 200–320 nanometers in the DUV range and further including means to provide one or more high energy, short duration pulses of radiantion of 20 millijoules per square centimeter for each flash.

10. The apparatus of claim 1 wherein said lamp has an overall longitudinal dimension of one inch (2.54 cm.).

* * * * *